US010111332B1

(12) United States Patent
Sasaki et al.

(10) Patent No.: US 10,111,332 B1
(45) Date of Patent: Oct. 23, 2018

(54) COMPOSITE CABLE TO BE CONNECTED TO FLAT PANEL-SHAPED ELECTRICAL EQUIPMENT

(71) Applicant: SMK Corporation, Tokyo (JP)

(72) Inventors: Tadahito Sasaki, Ibaraki (JP); Kohei Homma, Kanagawa (JP); Mitsuhiro Yoshida, Kanagawa (JP); Toyokazu Yoshino, Kanagawa (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 15/683,791

(22) Filed: Aug. 23, 2017

(30) Foreign Application Priority Data

Mar. 30, 2017 (JP) .................. 2017-066607

(51) Int. Cl.
| | |
|---|---|
| *H01R 12/00* | (2006.01) |
| *H05K 1/14* | (2006.01) |
| *G02B 6/44* | (2006.01) |
| *H01R 12/62* | (2011.01) |
| *H05K 1/02* | (2006.01) |
| *H05K 1/11* | (2006.01) |
| *G09F 9/302* | (2006.01) |
| *H01B 7/08* | (2006.01) |

(52) U.S. Cl.
CPC ........... *H05K 1/148* (2013.01); *G02B 6/4402* (2013.01); *G02B 6/4416* (2013.01); *G09F 9/3023* (2013.01); *H01B 7/0838* (2013.01); *H01R 12/62* (2013.01); *H05K 1/0219* (2013.01); *H05K 1/118* (2013.01)

(58) Field of Classification Search
CPC ...................................... H01R 12/59
USPC ........................... 439/67, 77, 495
See application file for complete search history.

(56) References Cited

U.S. PATENT DOCUMENTS

| | | | | |
|---|---|---|---|---|
| 5,737,053 A | * | 4/1998 | Yomogihara | ....... G02F 1/13452 349/149 |
| 8,754,332 B2 | * | 6/2014 | Sumida | ............... G02F 1/13452 174/254 |

FOREIGN PATENT DOCUMENTS

| | | |
|---|---|---|
| JP | 2011-019100 A | 1/2011 |
| JP | 5180856 B2 | 4/2013 |

\* cited by examiner

*Primary Examiner* — Phuong Dinh

(57) ABSTRACT

A composite cable is provided which can connect a power line for feeding drive power to flat panel-shaped electric equipment and a signal line for outputting an electric signal to the electrical equipment at the narrow side surface of the electrical equipment. A flexible printed circuit board constitutes an end connection unit of the flexible composite cable to be connected to the electrical equipment, so that the composite cable can be connected to a side surface of the electrical equipment. Since the lateral width of the flexible printed circuit board is sufficiently long, a power trace is made thin and wide, so that the resistance value per unit length can be reduced and a current carrying capacity that allows the use of high power current can be adopted.

3 Claims, 7 Drawing Sheets

COMPOSITE CABLE TO BE CONNECTED TO FLAT PANEL-SHAPED ELECTRICAL EQUIPMENT

CROSS REFERENCE TO RELATED APPLICATION

The contents of the following Japanese patent application are incorporated herein by reference, Japanese Patent Application No. 2017-066607 filed on Mar. 30, 2017.

FIELD

The present invention relates to a composite cable to be connected to electrical equipment in the shape of a flat panel, and more specifically relates to a composite cable that feeds power to the flat panel-shaped electrical equipment, and simultaneously outputs electrical signals.

BACKGROUND

As electrical equipment in the shape of a flat panel, there is, for example, a display device 101 of a wall-mounted television 110 situated on a wall surface. In the wall-mounted television 110, as shown in FIGS. 6 and 7, an additional device 102, which includes a communication control unit 102b for processing video signals to be displayed on the display device 101 and a power supply unit 102a for the display device 101, is disposed in a recessed box SB embedded in a wall panel WP so as to prevent the display device 101 from protruding far from the wall surface. Drive power is fed into the display device 101 through a power line 103 connected between the additional device 102 and a rear surface of the display device 101. Electrical signals such as the video signals are outputted to the display device 101 through signal lines 104 (Patent Literature 1).

Such a wall-mounted television 110 attached to the wall surface requires boring a hole in the wall panel WP to contain the additional device 102 in the recessed box SB embedded in the wall panel WP. Since the wall panel WP requires working and the hole limits the position of attachment, the wall-mounted television 110 cannot be moved to a desired position. Thus, a set top box STB for outputting video signals and control signals to the display device is separated from the display device, and the set top box STB and the display device are connected with cables or wireless communications as described in Patent Literature 2. This facilitates slimming of the display device, i.e., the flat panel-shaped electrical equipment, and allows the display device to be disposed in an arbitrary position.

CITATION LIST

Patent Literature

Patent Literature 1: Japanese Patent No. 5180856
Patent Literature 2: Japanese Patent Application Laid-Open No. 2011-19100

SUMMARY

Technical Problem

When the display device and the set top box STB are connected with wireless communications, as described in Patent Literature 2, the display device is required to have a wireless transceiver circuit, thus complicating the structure of the display device and interfering with the slimming.

Irrespective of whether the set top box STB and the display device are connected with wireless communications or with connection cables, at least a power cable has to be connected to the display device to feed drive power to the display device. Besides, in recent years, display devices used in wall-mounted televisions have reduced thicknesses of 3 mm or less using organic EL elements. It is required to reduce the thickness of the display device protruding from a wall surface within 3 mm, including a cable. In such an instance, the power cable is connected to a connection unit such as a connector provided in a side surface of the display device having a thickness of 3 mm or less. On the other hand, the display devices tend to be large in size, while being slimmed. A large current of the order of 10 A to 20 A flows through a power line to drive a display layer of a large organic EL or liquid crystal screen. Accordingly, a power line has to have a current carrying capacity of this current value or more. When the power line of the power cable is made of, for example, round metal wires, the entire power line including an insulating sheath has a thick diameter of the order of 3 mm, thus bringing about a difficulty in connection to the side surface of the display device.

Moreover, besides the power cable, when a connection cable including high-speed signal lines for outputting large video signals to the display device and a connection cable including low-speed signal lines for outputting control signals to control the operation of the display device are connected, all the connection cables are connected to the narrow side surface of the slim display device, thus severely complicating connection operation.

Using a flexible printed circuit board, which has a signal pattern functioning as signal lines formed on its surface, as the connection cables allows connection to the narrow side surface having a thickness of 3 mm or less of the display device. However, the flexible printed circuit board has rigidity and is hard to bend in its width direction, and thereby impairs wiring flexibility in connection between the set top box STB and the display device. Also, the flexible printed circuit board is more expensive per unit length than a round cable such as a cabtyre cable, and hence is not suited for practical use.

Furthermore, although the current carrying capacity of the conductive pattern formed in the surface of the flexible printed circuit board increases depending on the cross-sectional area of the conductive pattern, the conductive pattern has a thickness of the order of 35 μm, so that it seems difficult to have a current carrying capacity equal to or more than the power supply current of 10 A to 20 A. Therefore, no flexible printed circuit board having a power supply pattern formed thereon has been used as the power cable to feed drive power to the display device.

The present invention has been made in consideration of the problems as described above, and an object of the present invention is to provide a composite cable that contributes to further slimming of electrical equipment in the shape of a flat panel, without providing a signal processing circuit and a power supply circuit for the flat panel-shaped electrical equipment.

Another object of the present invention is to provide a composite cable that can connect a power line for feeding drive power to electrical equipment and signal lines for outputting electrical signals to the electrical equipment to a narrow side surface of the flat panel-shaped electrical equipment.

Further another object of the present invention is to provide a composite cable that connects between a display device in the shape of a flat panel and a set top box STB for supplying video signals and drive power to the display device with an inexpensive cable having high wiring flexibility.

Solution to Problem

To achieve the objects described above, a composite cable according to a first aspect is connected to electrical equipment in the shape of a flat panel. The composite cable includes a power line for feeding drive power to the electrical equipment; a signal line for outputting an electrical signal to the electrical equipment, the power line and the signal line being integrated into the composite cable being flexible; and a flexible printed circuit board for constituting an end connection unit of the flexible composite cable to be connected to the electrical equipment, the flexible printed circuit board being inserted from a side surface of the electrical equipment to establish connection to the electrical equipment. A signal trace functioning as the signal line and a power trace functioning as the power line are formed in parallel in the flexible printed circuit board. The power trace is wider than the signal trace in accordance with a current carrying capacity of the power line.

Since the end connection unit of the composite cable to be connected to the electrical equipment is constituted of the flexible printed circuit board, the power line and the signal line can be connected to the electrical equipment by inserting the flexible printed circuit board from the narrow side surface of the flat panel-shaped electrical equipment.

Since the flexible printed circuit board is able to have an enough width within the limit of the width of the side surface of the electrical equipment in a longitudinal direction, it is possible to increase the width of the power trace and enlarge the cross-sectional area of the power trace, in order to increase the current carrying capacity of the power trace functioning as the power line.

Since only the end connection unit of the composite cable to be connected to the electrical equipment is constituted of the flexible printed circuit board, there is no limitation in the bending direction of the composite cable.

According to a second aspect of the composite cable, the electrical equipment has a plurality of circuit elements that operate at different levels of power. In the composite cable, a plurality of the power traces for feeding the drive power to the respective circuit elements are formed in parallel on one surface of the flexible printed circuit board. The power traces connected to the respective circuit elements have different widths in accordance with power consumptions of the individual circuit elements.

Since the plurality of power traces are correspondingly formed to feed the drive power to each of the plurality of circuit elements of the electrical equipment operating at the different levels of power, there is no need to provide constant-voltage power supply circuits, which each divide input voltage and feed a stable power voltage to each of the circuit elements, in the electrical equipment.

The composite cable according to a third aspect is a composite cable into which an active optical cable in addition to the power line and the signal line is integrated, and an optical waveguide of the active optical cable to output a high-speed electrical signal to the electrical equipment is formed in the flexible printed circuit board, in which the power trace functioning as the power line and the signal trace for outputting a low-speed electrical signal to the electrical equipment are formed.

Since the optical waveguide of the active optical cable to output the high-speed electrical signal to the electrical equipment is formed in the flexible printed circuit board in which the power trace functioning as the power line and the signal trace for outputting the low-speed electrical signal to the electrical equipment are formed, the power line, the signal line for outputting the low-speed electrical signal, and the active optical cable for outputting the high-speed electrical signal can be connected to the electrical equipment by inserting the flexible printed circuit board from the narrow side surface of the flat panel-shaped electrical equipment.

In the composite cable according to a fourth aspect, the electrical equipment is a flat display device, and a control signal to control the operation of the flat display device is outputted through the signal trace, and a large video signal to display video on the flat display device is outputted through the optical waveguide.

Since the power line for feeding the drive power to the flat display device, the signal line for outputting the control signal, and the optical waveguide for outputting the large video signal are collectively connected at the side surface of the flat display device, it is possible to reduce the entire thickness of the flat display device having the composite cable connected thereto.

According to the first aspect of the invention, since the power line and the signal line are connected to the electrical equipment by inserting the flexible printed circuit board from the narrow side surface of the flat panel-shaped electrical equipment, the entire thickness of the electrical equipment having the composite cable connected thereto is not increased.

The power line for feeding the drive power to the electrical equipment and the signal line for outputting the electrical signal to the electrical equipment can be collectively and easily connected to the narrow side surface of the flat panel-shaped electrical equipment.

Even the power line having a large current carrying capacity can be formed of a thin power trace in the flexible printed circuit board.

The composite cable for connecting the flat panel-shaped electrical equipment can be inexpensive, and have high wiring flexibility in every direction without limitation in a bending direction.

According to the second aspect of the invention, it is not required to provide the constant-voltage power supply circuits each constituted of an IC circuit element having a certain thickness in outer dimensions such as an operational amplifier and a three-terminal regulator in the electrical equipment. Thus, the electrical equipment can be further slimmed.

According to the third aspect of the invention, the power line for feeding the drive power to the electrical equipment, the signal line for outputting the low-speed electrical signal to the electrical equipment, and the active optical cable for outputting the high-speed electrical signal to the electrical equipment can be collectively and easily connected to the narrow side surface of the flat panel-shaped electrical equipment.

Since the power line, the signal line for outputting the low-speed electrical signal, and the optical waveguide of the active optical cable can be integrated in the flexible printed circuit board, the third aspect of the present invention is superior in design and eliminates the risk that a user divides individual wires and wrongly connects the wires.

According to the fourth aspect of the invention, since the power line for feeding the drive power can be connected to the narrow side surface, without providing a signal processing circuit for processing a large video signal in the flat display device, it is possible to slim the entire flat display device having the composite cable connected thereto, and attach the flat display device almost flush with the wall surface.

DESCRIPTION OF EMBODIMENTS

Figure 1:
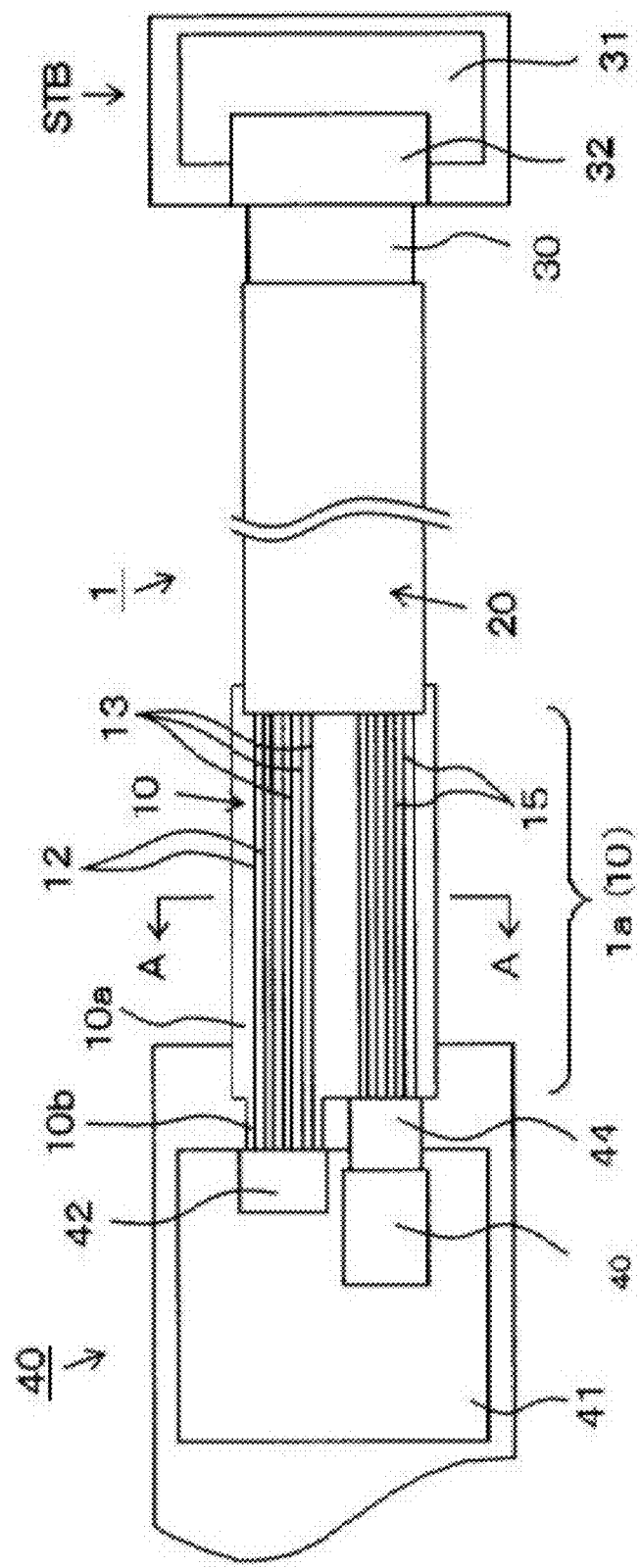
FIG. 1 is a plan view of a composite cable 1 according to an embodiment of the present invention for connecting between a flat display device 40 and a set top box STB.

A composite cable 1 according to an embodiment of the present invention will be described with reference to FIGS. 1 to 5. As shown in FIG. 1, the composite cable 1, which is disposed between a flat display device 40 (a flat panel-shaped electrical equipment) and a set top box STB, is a composite cable into which a plurality of power lines 2, a plurality of signal lines 3, and a plurality of active optical cables 5 are integrated.

In this embodiment, the flat display device 40 is a so-called wall-mounted television attached on a wall surface. The flat display device 40 uses organic EL elements as display elements and has a thickness of 3 mm or less, so as to minimize the amount of protrusion from the wall surface. For the purpose of slimming to 3 mm or less, the flat display device 40 includes none of a tuner for receiving video to be displayed on the flat display device 40, a signal processing circuit for video signals, a power supply circuit for driving the flat display device 40, and the like so as to reduce the thickness as much as possible. These circuits such as the tuner are contained in the set top box STB, which is situated several meters away from the flat display device 40 attached on the wall surface, while being connected to the flat display device 40 through the composite cable 1. Relatively low-speed control signals to control the operation of the flat display device 40 are outputted from the set top box STB through the six signal lines 3 of the composite cable 1. Video signals that require large-capacity high-speed transmission are outputted from the set top box STB through the four active optical cables 5.

Furthermore, a display unit of the flat display device 40 operates at drive power of 24V/240 W, while a control circuit for controlling the display unit and an encryption circuit HDCP and the like operate at drive power of 12V/40 W. Thus, the flat display device 40 has different two power systems. To feed power to the flat display device 40 from stable two power systems into which one type of input power voltage is divided, it is required to provide constant-voltage power supply circuits each constituted of an IC circuit element having a certain thickness in outer dimensions such as an operational amplifier and a three-terminal regulator. In this embodiment, the constant-voltage power supply circuits are contained in the set top box STB, and drive power of different drive sources is fed from the set top box STB to each circuit of the flat display device 40 through two pairs of power lines, i.e., a pair of first power lines 2a and a pair of second power lines 2b, the number of pairs of which is the same as the number of power systems (two power systems in this embodiment) of the flat display device 40.

The composite cable 1 is constituted of a flexible printed circuit board (hereinafter called FPC) 10 having a length of the order of 200 mm to be connected to the flat display device 40, and a cabtyre cable 20 of several meters to be connected to the set top box STB. The flexible printed circuit board 10 and the cabtyre cable 20 are connected in series. The cabtyre cable 20 is a round cable into which the above-described two pairs of power lines 2, the six signal lines 3, and four optical fibers 15 that are optical waveguides of the active optical cables 5 are integrated and covered with a sheath. In a connection portion between the cabtyre cable 20 and the FPC 10, the optical fibers 15 of the active optical cables 5 continuously extend from the cabtyre cable 20 to the FPC 10, while the two pairs of power lines 2a and 2b and the plurality of signal lines 3 of the cabtyre cable 20 are soldered to corresponding two pairs of power traces 12a and 12b and six signal traces 13 formed in the FPC 10 to be described later, respectively, so as to establish mutual electrical connection.

Since a relatively large current of the order of 10 A at the maximum flows through the power lines 2 as the drive power for the flat display device 40, the power lines 2 of the cabtyre cable 20 are made of thick wires having a conductor diameter of 2 to 3 mm so as to have a current carrying capacity of 10 A or more. On the other hand, although the entire optical fiber 15 including a sheath of the optical fiber 15 has a thickness of the order of 250 μm, the outer diameter of the cabtyre cable 20 into which the power lines 2 and the signal lines 3 are integrated has a thickness of 10 mm.

Although the cabtyre cable 20 has an outer diameter of approximately 10 mm, the set top box STB has no limitation in a connection position and the size of a connection portion. An optical-electrical composite plug 30 is attached to the cabtyre cable 20 such that end portions of the power lines 2, the signal lines 3, and the optical fibers 15 face to the optical-electrical composite plug 30. The optical-electrical composite plug 30 is fitted into a receptacle 32 mounted on a printed circuit board 31 of the set top box STB, so that the plurality of power lines 2 and the plurality of signal lines 3 are electrically connected to corresponding circuits of the set top box STB.

Figure 5:
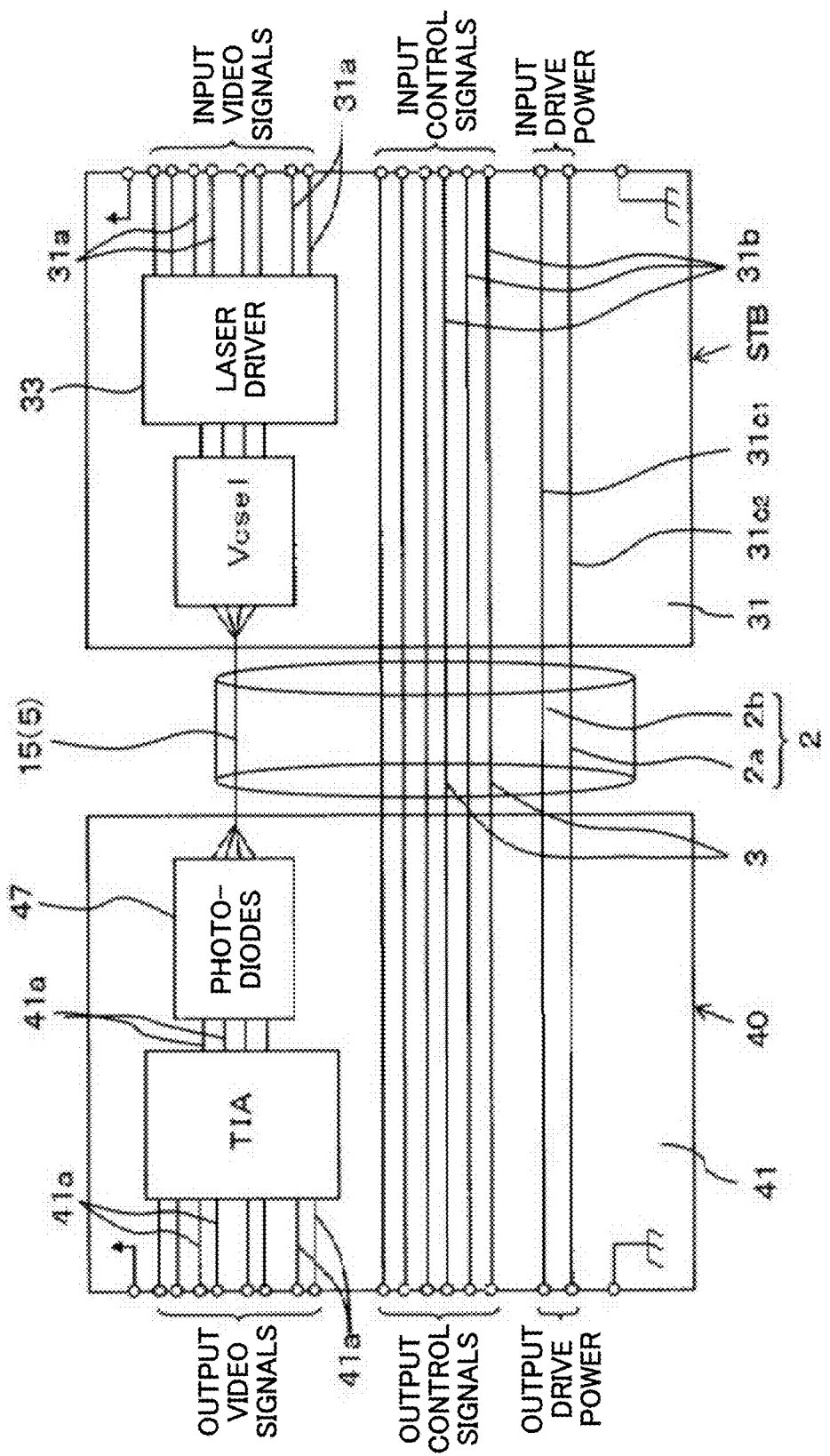
FIG. 5 is a block diagram of FIG. 1.
Figure 6:
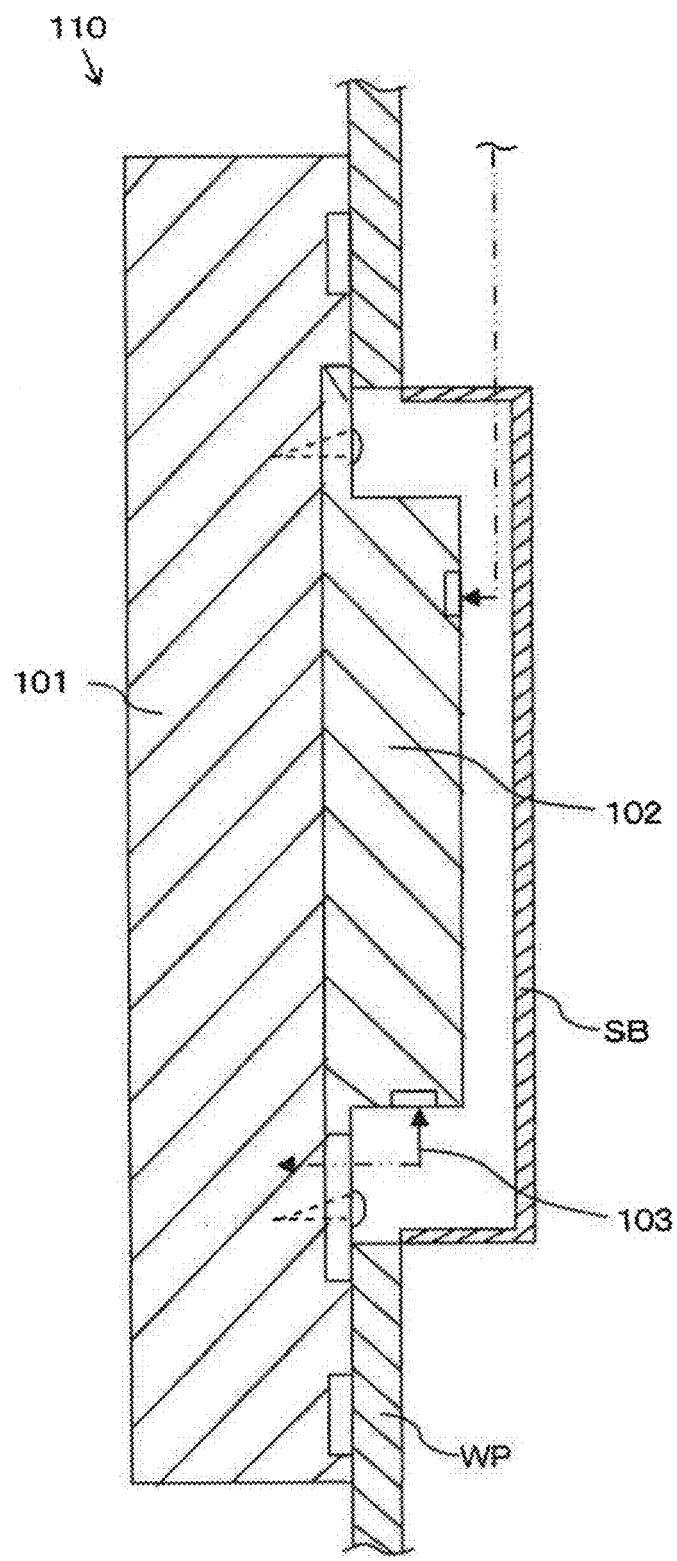
FIG. 6 is a longitudinal cross-sectional view of a related power line 103 for connecting between a display device 101 and an additional device 102.
Figure 7:
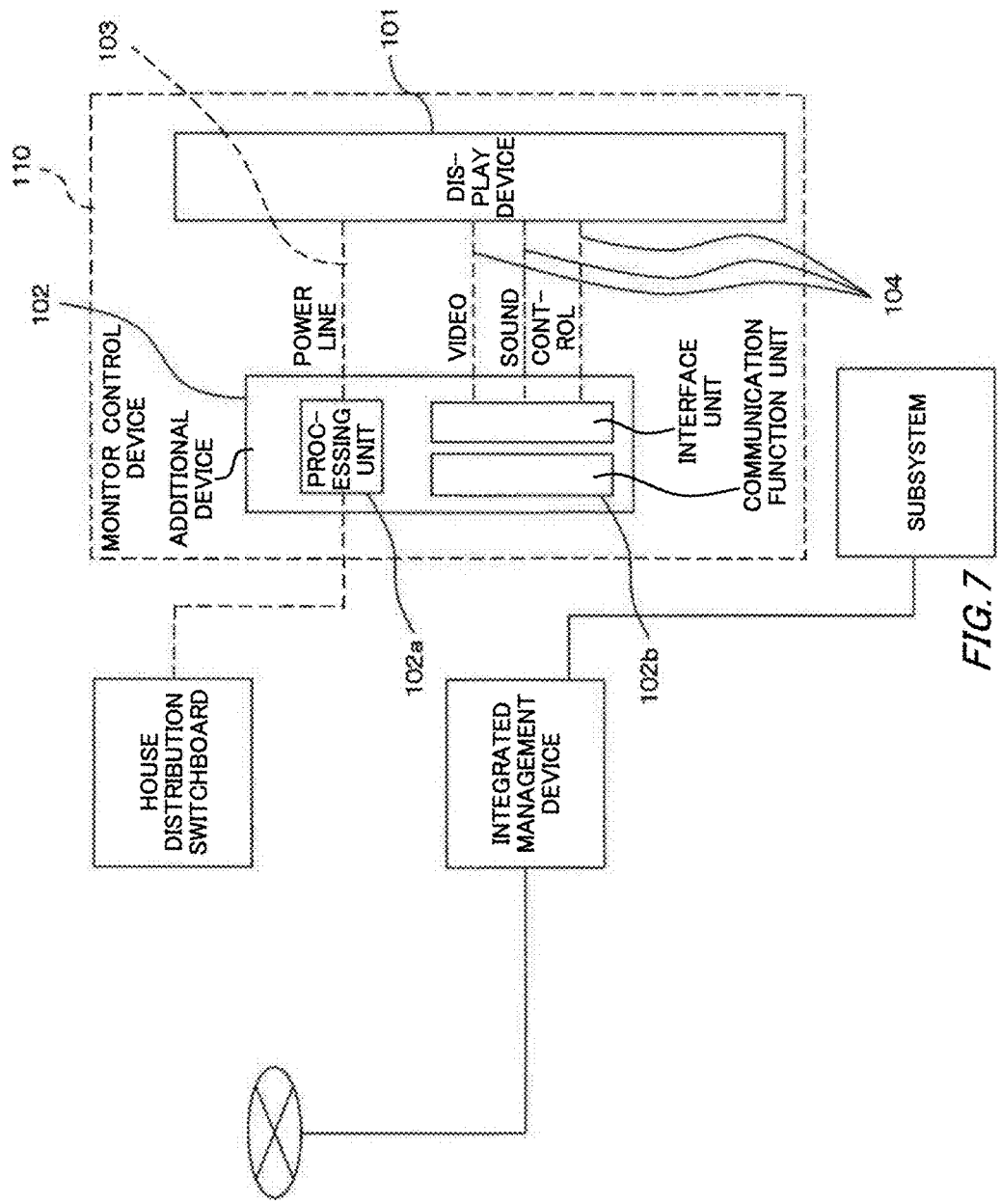
FIG. 7 is a block diagram of a wall-mounted television 110.

As shown in FIG. 5, the receptacle 32 contains a vertical cavity surface emitting laser Vcsel, which is driven and controlled by a laser driver 33. The vertical cavity surface emitting laser Vcsel applies electric-optic conversion to signals inputted to the laser driver 33, and outputs the converted signals to the optical fibers 15, which face to the optical-electrical composite plug 30. As shown in FIG. 5, video signals that are transmitted at a speed of 3.75 Gbps per lane via a V-by-One (a trademark of THine Electronics, Inc.) HS serial interface are inputted to four lanes of high-speed signal traces 31a of the set top box STB. The vertical cavity surface emitting laser Vcsel applies electric-optic conversion to the video signals, and outputs the converted optical signals to the four optical fibers 15 corresponding to the four lanes, respectively.

For example, control signals that are transmitted at a speed of several tens of Mbps to control the operation of the encryption circuit HDCP and the organic EL display elements of the flat display device 40 are inputted to six low-speed signal traces 31b of the set top box STB. The control signals are outputted to the flat display device 40 through the six signal lines 3 connected to the six low-speed signal traces 31b, respectively.

Furthermore, in the printed circuit board 31 of the set top box STB, first power feed traces 31c1 and second power feed traces 31c2 are formed so as to correspond to the two power systems of the flat display device 40. Here, the first power feed traces 31c1 feed the drive power of, for example, 24V/240 W to the display unit of the flat display device 40 through the first power lines 2a of the composite cable 1. The second power feed traces 31c2 feed the drive power of, for example, 12V/40 W to the control circuit and the like of the flat display device 40 through the second power lines 2b of the composite cable 1. Therefore, there is no need to provide constant-voltage power supply circuits in the flat display device 40 to feed stable power from a plurality of different power systems, thus contributing to slimming of the flat display device 40 to the order of 3 mm.

The cabtyre cable 20 having an outer diameter of 10 mm cannot be directly connected to the flat display device 40, under the constraints that connection of the composite cable 1 does not cause an increase in the amount of protrusion from the wall surface and the composite cable 1 is connected to the side surface of the flat display device 40 having a thickness of 3 mm. Thus, the composite cable 1 is connected to the flat display device 40 using the FPC 10, which is thin enough to be connectable within a lateral width of the side surface of 3 mm and long enough in a width along a longitudinal direction of the side surface.

In the composite cable 1, the FPC 10, which functions as an end connection unit 1a on the side of the flat display device 40, has the two pairs of power traces 12a and 12b functioning as the two pairs of power lines 2a and 2b and the six signal traces 13 functioning as the six signal lines 3. These traces are printed in parallel along a longitudinal direction on a surface of an insulating substrate film 10a, which is made of polyimide or the like into a thickness of 0.1 mm. The four optical fibers 15 are laminated in parallel with the traces 12 and 13 in blank space of the insulating substrate film 10a of the FPC 10 so as not to interfere with the power traces 12 and the signal traces 13, whereby the optical-electrical composite FPC 10 is formed.

Figure 2:
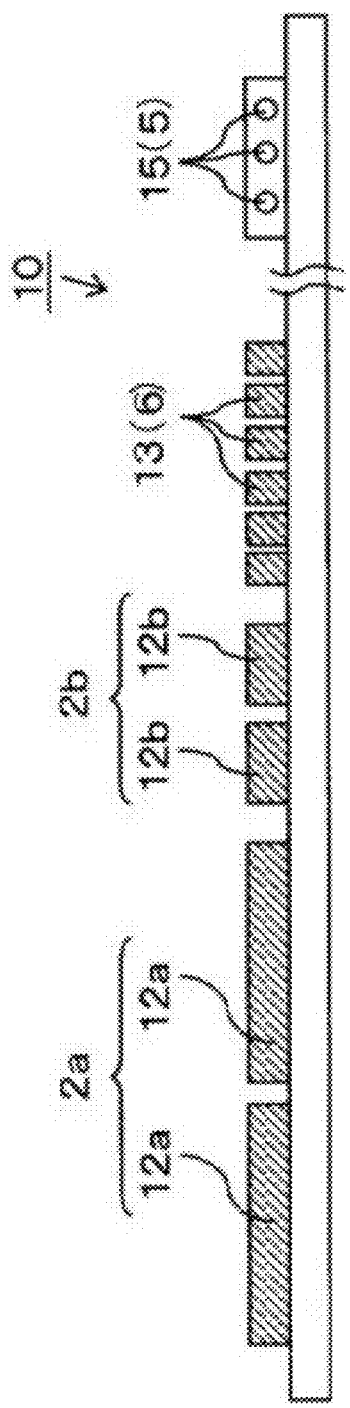
FIG. 2 is a partially omitted cross-sectional view taken along line A-A of FIG. 1.

Since the first power traces 12a functioning as the first power lines 2a feed the power of 24V/240 W to the display unit of the flat display device 40, the power traces 12a are required to have a current carrying capacity of 10 A or more. Although the thickness of the power trace 12 formed on the insulating substrate film 10a is only on the order of 35 μm, the resistance value of the power trace 12 per unit length is inversely proportional to the cross-sectional area thereof, and the FPC 10 can be wide enough. Therefore, as shown in FIG. 2, the first power traces 12a each have a width of 10 mm or more that is wider than the other common printed traces such as signal traces 13, in order to reduce the resistance value per unit length and have a current carrying capacity of 10 A or more.

Since the second power traces 12b functioning as the second power lines 2b feed the power of 12V/40 W to the control circuit for controlling the display unit and the encryption circuit HDCP of the flat display device 40 and the like, the power traces 12b are required to have a current carrying capacity of 3.4 A or more. Therefore, the second power traces 12b each have a width of 4 mm that is wider than other traces such as signal traces 13.

Figure 4:
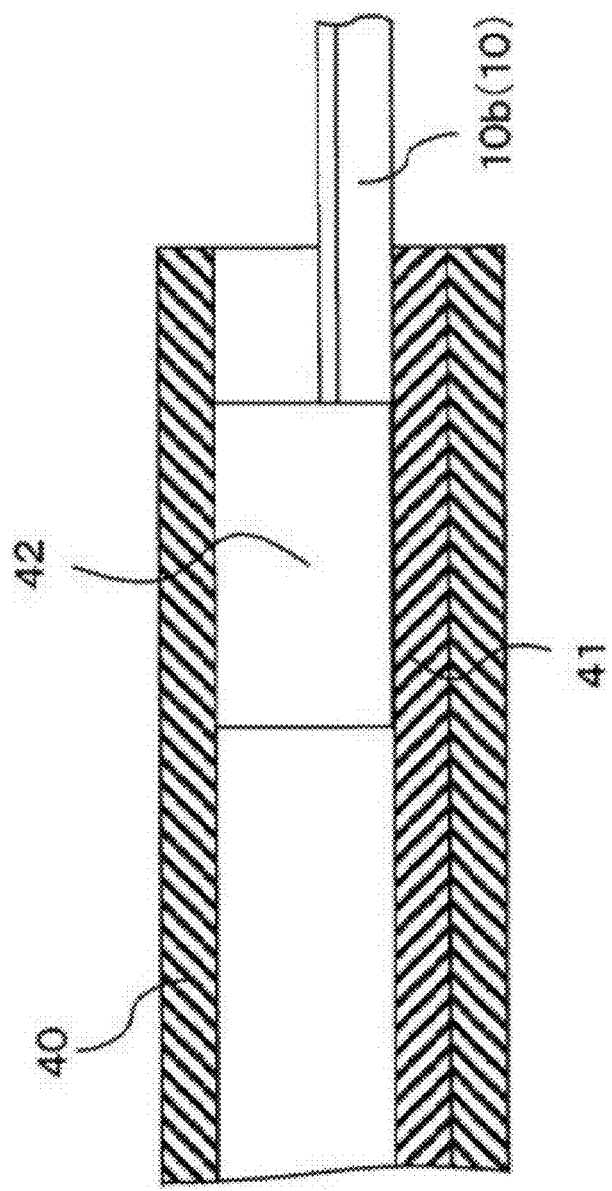
FIG. 4 is an enlarged cross-sectional view showing a connection portion between a flexible printed circuit board 10 and the flat display device 40.

The first power traces 12a, the second power traces 12b, and the six signal traces 13 extend to a tail portion 10b, which protrudes to the side of the flat display device 40, of the FPC 10. As shown in FIG. 4, the first power traces 12a, the second power traces 12b, and the six signal traces 13 are inserted into a connection recess of an FPC connector 42 mounted on a printed circuit board 41 of the flat display device 40, together with the tail portion 10b, so as to establish electrical connection to corresponding conductor traces of the printed circuit board 41 through not-shown contacts of the FPC connector 42. Therefore, the power of 24V/240 W is fed through the first power traces 12a into the display unit of the flat display device 40, and the power of 12V/40 W is fed through the second power traces 12b into the control circuit for controlling the display unit and the encryption circuit HDCP of the flat display device 40, and the like. The relatively low-speed control signals for controlling each circuit element of the flat display device 40 are outputted from the six signal traces 13. Since the printed circuit board 41 has a thickness of 0.5 mm, though the FPC connector 42 has a thickness of 1.2 mm, the FPC 10 of the composite cable 1 can be connected to the side surface of the flat display device 40 having a thickness of 3 mm.

An optical plug 44 is attached to end portions of the four optical fibers 15 fixed on the FPC 10, so as to face the end portions of the optical fibers 15 on the flat display device 40 and fix the positions of the optical fibers 15. The optical plug 44 is fitted into and connected to a receptacle 43, which is mounted at the side of the FPC connector 42 on the printed circuit board 41 of the flat display device 40. The height of the receptacle 43 into which the optical plug 44 is fitted is 1.7 mm at the maximum, even with the printed circuit board 41 having a thickness of 0.5 mm, so that the optical plug 44 can be connected to the side surface of the flat display device 40 having a width of 3 mm.

Figure 3:
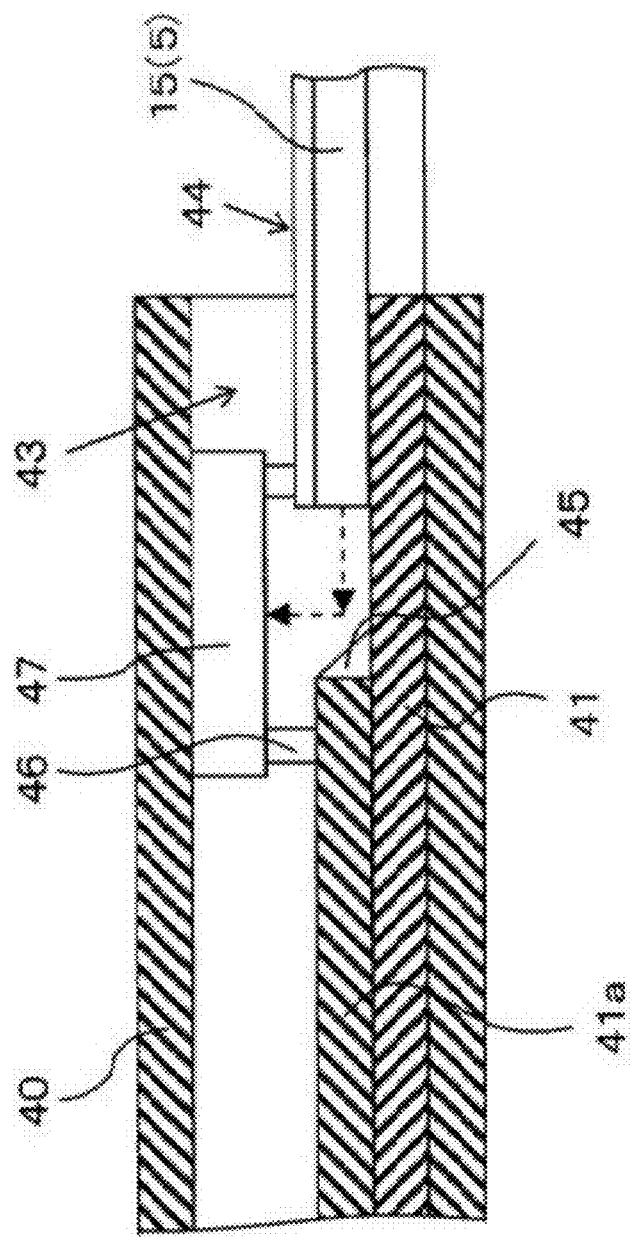
FIG. 3 is an enlarged cross-sectional view showing a connection portion of an active optical cable 5 to the flat display device 40.

As shown in FIG. 3, the receptacle 43 contains 45-degree mirrors 45 and photodiodes 47. The 45-degree mirrors 45 are each disposed so as to oppose an end surface of each of the four optical fibers 15 in order to convert a horizontal optical axis of each optical fiber 15 into a vertical direction. The photodiodes 47 are each mounted on a high-speed signal trace 41a of the printed circuit board 41 via a gold bump 46 such that a light receiving surface of the photodiode 47 faces to the 45-degree mirror 45. The photodiodes 47 perform photoelectric conversion of optical signals that represent video signals ejected from the end surfaces of the four optical fibers 15 at a transmission speed of 3.75 Gbps, and output converted signals through corresponding four conductive traces 41a into a transimpedance amplifier TIA connected to outputs of the conductive traces 41a.

The transimpedance amplifier TIA converts the weak current signals representing the video signals outputted from the photodiodes 47 into voltage signals, and outputs the voltage signals through four lanes of high-speed signal traces 41a corresponding to the four optical fibers 15, respectively, to an organic EL driver for controlling the display of the display unit of the flat display device 40. Thus, video is displayed on the display unit by the video signals transmitted from the set top box STB at a transmission speed of 3.75 Gbps per lane.

According to this embodiment, a main part of the composite cable 1, which connects between the set top box STB and the flat display device 40 i.e. electrical equipment in the shape of a flat panel, is constituted of the cabtyre cable 20 flexibly bendable in every direction. Thus, there is no limitation in the wiring position of the composite cable 1. Since the cabtyre cable 20 that is less expensive than the FPC 10 is used in the main part, the composite cable 1 can be obtained inexpensively.

In the above-described embodiment, the flat display device having a thickness of 3 mm is taken as an example of the flat panel-shaped electrical equipment, but the electrical equipment is not limited to the display device as long as the electrical equipment is in the shape of a flat panel.

The composite cable 1 is a cable into which the active optical cables 5 are integrated with the power lines 2 and the signal lines 3 in the above-described embodiment, but may be a composite cable into which only the power lines 2 and the signal lines 3 are integrated. Furthermore, the active optical cables 5 are coupled to both end portions of the optical fibers with connection of optic-electric conversion elements and electric-optic conversion elements, but only the optical fibers 15 as optical waveguides may be integrated with the power lines 2 and the signal lines 3 into a composite cable.

Furthermore, the numbers and shapes of the power lines 2, the signal lines 3, and the active optical cables 5 integrated into the composite cable 1 are not limited to the above-described embodiment. In particular, the number of the power lines 2 depends on the number of power systems of the flat panel-shaped electrical equipment, and the width of each power trace is determined such that the power trace has a current carrying capacity equal to or more than a maximum current of power to be fed through the power trace.

Furthermore, the video signals are transmitted from the set top box STB to the flat display device 40 through the optical waveguides of the four optical fibers 15 in the above-described embodiment, but the control signals for controlling the operation of the flat display device 40 may be transmitted therethrough instead. The signals outputted from the set top box STB through the signal lines 3 to the flat display device 40 are not limited to the control signals, but may be the video signals or part of the video signals.

The embodiment of the present invention is applicable to composite cables that are electrically connected to electrical equipment in the shape of a flat panel, in order to feed power from external equipment to the electrical equipment, as well as output control signals for controlling the operation of the electrical equipment.

REFERENCE SIGNS LIST 1 composite cable
1a end connection unit
2 power line
3 signal line
5 active optical cable
10 flexible printed circuit board (FPC)
12 power trace
13 signal trace
15 optical fiber (optical waveguide)
20 cabtyre cable
40 flat panel-shaped electrical equipment (flat display device)

The invention claimed is:

1. A composite cable, configured to be connected to electrical equipment in a shape of a flat panel, the composite cable comprising:
   a power line for feeding drive power to the electrical equipment;
   a signal line for outputting an electrical signal to the electrical equipment, the power line and the signal line being integrated into the composite cable being flexible; and
   a flexible printed circuit board for constituting an end connection unit of the flexible composite cable to be connected to the electrical equipment, the flexible printed circuit board being inserted from a side surface of the electrical equipment to establish connection to the electrical equipment, a signal trace functioning as the signal line and a power trace functioning as the power line being formed in parallel in the flexible printed circuit board, wherein
   the power trace is wider than the signal trace in accordance with a current carrying capacity of the power line, wherein
   the composite cable is a composite cable into which an active optical cable in addition to the power line and the signal line is integrated, and
   an optical waveguide of the active optical cable to output a high-speed electrical signal to the electrical equipment is formed in the flexible printed circuit board, in which the power trace functioning as the power line and the signal trace for outputting a low-speed electrical signal to the electrical equipment are formed.

2. The composite cable according to claim 1, wherein
   the electrical equipment has a plurality of circuit elements that operate at different levels of power,
   a plurality of the power traces for feeding the drive power to the respective circuit elements are formed in parallel on one surface of the flexible printed circuit board, and
   the power traces connected to the respective circuit elements have different widths in accordance with power consumptions of the individual circuit elements.

3. The composite cable according to claim 1, wherein
   the electrical equipment is a flat display device,
   a control signal to control an operation of the flat display device is outputted through the signal trace, and
   a large video signal to display video on the flat display device is outputted through the optical waveguide.

* * * * *